(12) United States Patent
Hur

(10) Patent No.: US 7,940,095 B2
(45) Date of Patent: May 10, 2011

(54) SEMICONDUCTOR MEMORY DEVICE AND METHOD FOR DRIVING THE SAME

(75) Inventor: Hwang Hur, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 44 days.

(21) Appl. No.: 12/005,584

(22) Filed: Dec. 27, 2007

(65) Prior Publication Data

US 2008/0204094 A1 Aug. 28, 2008

(30) Foreign Application Priority Data

Feb. 28, 2007 (KR) ........................ 10-2007-0020305

(51) Int. Cl.
*H03L 7/06* (2006.01)
(52) U.S. Cl. ........................................ 327/158; 327/175
(58) Field of Classification Search ........................ None
See application file for complete search history.

(56) References Cited

U.S. PATENT DOCUMENTS

| | | | | |
|---|---|---|---|---|
| 5,757,218 A * | 5/1998 | Blum | ................................ | 327/175 |
| 6,788,120 B1 * | 9/2004 | Nguyen | ........................ | 327/172 |
| 6,927,642 B2 * | 8/2005 | Hsieh | ............................ | 331/175 |
| 7,414,451 B2 * | 8/2008 | Lee | ................ | 327/292 |
| 7,496,155 B1 * | 2/2009 | Lu et al. | ........................ | 375/326 |
| 2007/0001724 A1 * | 1/2007 | Na | ................................ | 327/158 |
| 2007/0076832 A1 * | 4/2007 | Matsudera | ................ | 375/371 |
| 2007/0176657 A1 * | 8/2007 | Byun et al. | .................... | 327/158 |
| 2008/0001640 A1 * | 1/2008 | Choi | ............................ | 327/158 |
| 2009/0322390 A1 * | 12/2009 | Shim | ............................ | 327/158 |

FOREIGN PATENT DOCUMENTS

KR 10-0598101 6/2006
KR 10-0641703 10/2006

* cited by examiner

*Primary Examiner* — Lincoln Donovan
*Assistant Examiner* — Sibin Chen
(74) *Attorney, Agent, or Firm* — Blakely, Sokoloff, Taylor & Zafman

(57) ABSTRACT

The present invention intends to provide a semiconductor memory device including a delay locked loop (DLL) circuit capable of generating a duty-corrected delay locked clock. A semiconductor memory device includes: a DLL circuit for generating a delay locked clock through a delay locked operation; and a duty-correction circuit for correcting a duty ratio of the delay locked clock by using the delay locked clock and a divided clock generated by dividing the delay locked clock by an even value.

22 Claims, 8 Drawing Sheets

SEMICONDUCTOR MEMORY DEVICE AND METHOD FOR DRIVING THE SAME

CROSS-REFERENCE TO RELATED APPLICATIONS

The present invention claims priority of Korean patent application number 10-2007-0020305, filed on Feb. 28, 2007, which is incorporated by reference in its entirety.

BACKGROUND OF THE INVENTION

The present invention relates to a semiconductor memory device, and more particularly, to a delay locked loop (DLL) of a semiconductor memory device.

A system is implemented with a plurality of semiconductor devices having various functions. Among them, a semiconductor memory device has been used to store data. The semiconductor memory device outputs data corresponding to addresses received from a data processor, e.g., a central processing unit (CPU), or stores data received from the data processor into unit cells corresponding to addresses inputted together with the data.

As the operating speed of the system is increasing, the data processor requires the semiconductor memory device to input/output data at much higher speed. As semiconductor integrated circuit (IC) technologies are rapidly developed, the operating speed of the data processor increases, but the data input/output speed of the semiconductor memory device does not keep up with the increased operating speed of the data processor.

Many attempts have been made to develop semiconductor memory devices that can increase data input/output speed up to the level required by the data processor. One of these semiconductor memory devices is a synchronous memory device that outputs data at each period of a system clock. Specifically, the synchronous memory device outputs or receives data to or from the data processor in synchronization with the system clock. However, because even the synchronous memory device could not keep up with the operating speed of the data processor, a double data rate (DDR) synchronous memory device was developed. The DDR synchronous memory device outputs or receives data at each transition of the system clock. That is, the DDR synchronous memory device outputs or receives data in synchronization with falling edges and rising edges of the system clock.

However, the system clock necessarily has a predetermined delay time until it arrives at a data output circuit because it passes through a clock input buffer, a transfer line and the like. Thus, if the data output circuit outputs data in synchronization with the delayed system clock, an external device will receive data that are not synchronized with rising edges (rising transitions) and falling edges (falling transitions) of the system clock.

To solve this problem, the semiconductor memory device uses a delay locked loop (DLL) circuit to lock a delay of a clock signal. The DLL circuit compensates for the delay caused by internal circuits of the semiconductor memory device until the system clock input to the semiconductor memory device is transferred to the data output circuit. The DLL circuit detects the delay time of the system clock, which is caused by the clock input buffer, the clock transfer line and the like. of the semiconductor memory device. Then, the DLL circuit delays the system clock by the detected delay time and outputs the delayed system clock to the data output circuit. That is, the DLL circuit outputs the delay-locked system clock to the data output circuit. The data output circuit outputs data in synchronization with the delay-locked system clock. As a result, the data can be correctly output to the external circuit in synchronization with the system clock.

In an actual operation, the delay-locked system clock is transferred to the output buffer at a time point earlier by one period than a time point when the data must be outputted, and the output buffer outputs data in synchronization with the received delay locked system clock. Therefore, the data is outputted faster than the delay of the system clock caused by the internal circuit of the semiconductor memory device. In this way, it seems that the data may be correctly outputted in synchronization with the rising and falling edges of the system clock input to the semiconductor memory device. The DLL circuit is a circuit to seek how fast the data must be outputted in order to compensate for the internal delay of the system clock of the semiconductor memory device.

As a frequency of the system clock inputted in the semiconductor memory device is gradually increasing, an operating margin processed in order to output a data is gradually reducing. Accordingly, a duty ratio of the delay locked clock as a reference clock in order to output a data must keep up accurately 50% in order to maximize the operating margin outputting a data synchronized with a rising edge and a falling edge of the system clock. A recent DLL circuit includes a duty-correction circuit for correcting a duty ratio of the delay locked clock to 50%.

A most common method adjusting the duty ratio of the delay locked clock is performing a delay locked operation based on the rising edge of the system clock. At the same time, the delay locked operation based on the falling edge of the system clock is performed to generates a waveform including a transition which corresponds to a ½ location of a point of transition time of each delay locked clock. The DLL circuit includes two loop circuits in order to perform the delay locked operation based on the rising edge and the falling edge of the system clock. That is, because the DLL circuit includes two delay lines, the DLL circuit requires circuit blocks for duty-correction more than two times. In that case, there is a problem that a size of circuit and current consumption may be increased. Therefore, it is necessary to adjust the duty ratio of the delay locked clock to 50% for maximizing efficiency of the operating margin for outputting a data without requiring an extra circuit block.

SUMMARY OF THE INVENTION

Embodiments of the present invention are directed to a semiconductor memory device having a delay locked loop (DLL) circuit that can generate a duty-corrected delay locked clock.

Another embodiments of the present invention are directed to a semiconductor memory device having a DLL circuit using one DLL, capable of correcting a duty ratio.

Further other embodiments of the present invention are directed to a semiconductor memory device capable of correcting a duty ratio of an inputted clock signal.

In accordance with a first aspect of the present invention, there is provided a semiconductor memory device, including: a delay locked loop (DLL) circuit for generating a delay locked clock through a delay locked operation; and a duty-correction circuit for correcting a duty ratio of the delay locked clock by using the delay locked clock and a divided clock generated by dividing the delay locked clock by an even value.

In accordance with a second aspect of the present invention, there is provided a semiconductor memory device, including: a phase frequency comparator for comparing a phase of a reference clock and a feedback clock; a delay unit for outputting a delayed clock of the reference clock corresponding to a phase comparison result of the phase comparator; a dividing unit for dividing a clock outputted at the delay circuit by an even value; a first voltage generator for outputting and generating a first comparison voltage cumulating a value corresponding to a width of a first logic level of a clock outputted at the delay circuit; a second voltage generator for outputting and generating a second comparison voltage cumulating a value corresponding to a width of a first logic level of a clock outputted at the divide circuit; a comparator for comparing a slope of the first comparison voltage and the second comparison voltage; a duty-correction unit for correcting a duty ratio of a delayed clock outputted at the delay circuit corresponding to a comparison result of the comparator; and a delay model for providing the feedback clock by delaying a clock outputted at the duty-correction unit to a modeled value.

In accordance with a third aspect of the present invention, there is provided a semiconductor memory device, including: a dividing unit for dividing a reference clock by an even value; a first voltage generator for outputting and generating a first comparison voltage cumulating a value corresponding to a width of a first logic level of the reference clock; a second voltage generator for outputting and generating a second comparison voltage cumulating a value corresponding to a width of a first logic level of a clock outputted at the dividing unit; a comparator for comparing a slope of the first comparison voltage and the second comparison voltage; and a duty-correction unit for correcting a duty ratio of the reference clock corresponding to a comparison result of the comparator.

In accordance with a fourth aspect of the present invention, there is provided a method for driving a semiconductor memory device, including: generating a delay locked clock through a delay locked operation; and correcting a duty ratio of the delay locked clock by using the delay locked clock and a divided clock generated by dividing the delay locked clock by an even value.

In accordance with a fifth aspect of the present invention, there is provided a semiconductor memory device, including: a delay locked loop (DLL) circuit for generating a delay locked clock through a delay locked operation; a first integration circuit for cumulating a value corresponding to a width of a first level of the delay locked clock; a second integration circuit for cumulating a value corresponding to a width of a first level of a clock dividing the delay locked clock by an even value; a duty-correction unit for correcting a duty ratio of the delay locked clock by comparing a value cumulated in the first integration circuit with a value cumulated in the second integration circuit.

DESCRIPTION OF SPECIFIC EMBODIMENTS

Figure 1:
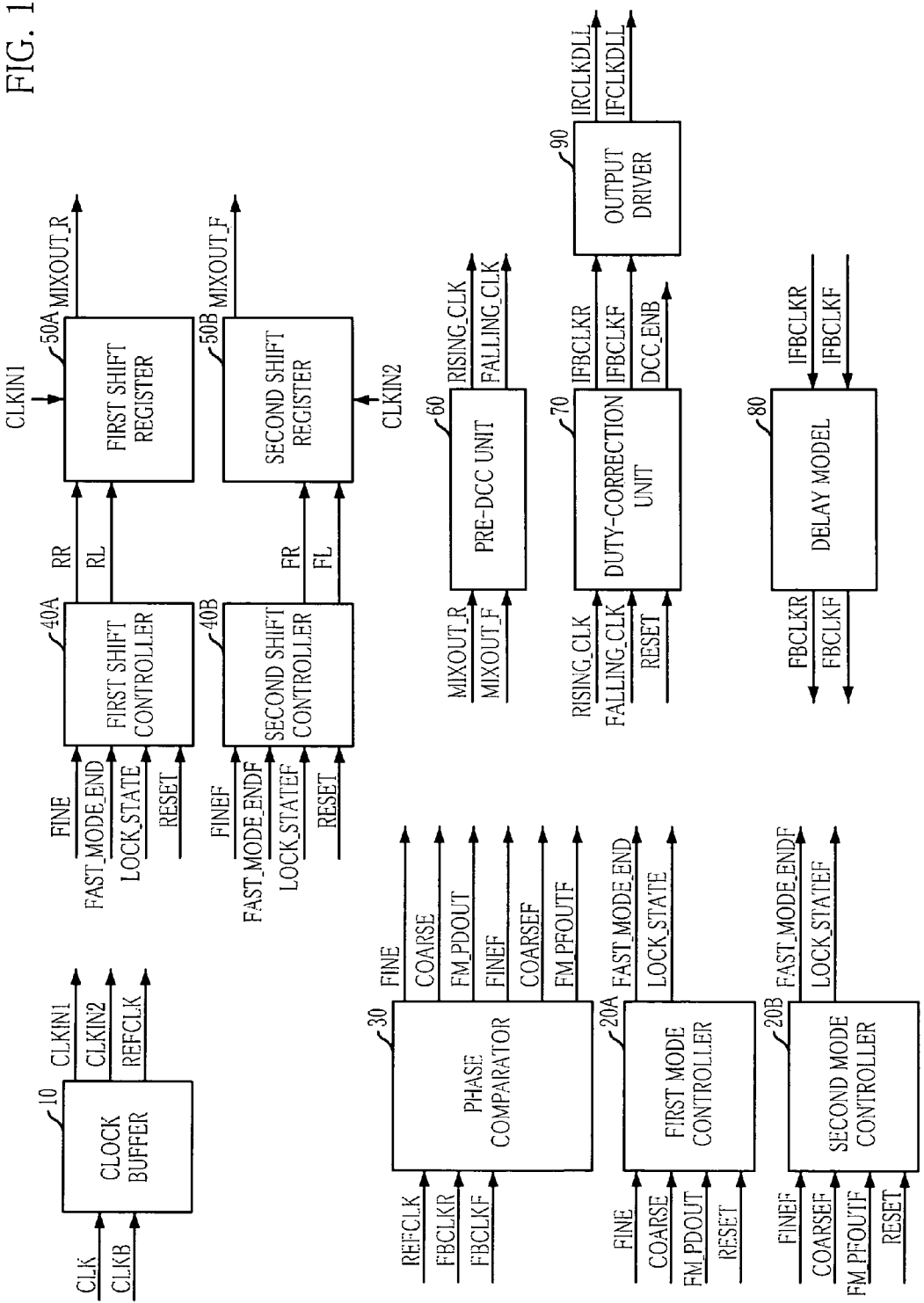
FIG. 1 is a schematic block diagram of a semiconductor memory device.

FIG. 1 is a block diagram of a semiconductor memory device. In particularly, the semiconductor device having a delay locked loop (DLL) circuit is described in detail.

As shown, the semiconductor memory device includes a clock buffer 10, a first mode controller 20A, a second mode controller 20B, a phase comparator 30, a first shift controller 40A, a second shift controller 40B, a first shift register 50A, a second shift register 50B, a pre-duty cycle correction (DCC) unit 60, a duty-correction unit 70, a delay model 80, and an output driver 90.

The clock buffer 10 buffers system clocks CLK and CLKB to generate a first internal clock signal CLKIN1, a second clock signal CLKIN2 and a reference clock REFCLK.

The phase comparator 30 compares a phase of the reference clock REFCLK with that of a rising feedback clock FBCLKR, and compares the phase of the reference clock REFCLK with that of a falling feedback clock FBCLKF to generate first and second fast locking signals FM_PDOUT and FM_PDOUTF and first and second normal locking signals corresponding to a comparison result.

In detail, the phase comparator 30 compares the phase of the reference clock REFCLK with that of the rising feedback clock FBCLKR to generate the first fast locking signal FM_PDOUT at a fast locking operation and generate the first normal locking signal at a normal locking operation. The fast locking operation changes relatively rapidly an adjustment of a delay value when the DLL circuit performs a delay locked operation, and the normal locking operation changes relatively slowly the adjustment of the delay value. The first normal locking signal includes a first coarse signal COARSE for controlling a delay operation of a coarse delay and a first fine signal FINE for controlling a delay operation of a fine delay. In general, because a shift register included in the DLL circuit employs the coarse delay and the fine delay, they are not illustrated herewith for the sake of convenience. A unit delay value of the coarse delay is relatively large, a unit delay value of the fine delay is relatively small.

Furthermore, the phase comparator 30 compares the phase of the reference clock REFCLK with that of the falling feedback clock FBCLKF to generate the second fast locking signal FM_PDOUTF at the fast locking operation and generate the second normal locking signal including a second coarse signal COARSEF and a second fine signal FINEF at the normal locking operation.

The first mode controller 20A generates a first fast mode control signal FAST_MODE_END and a first locking signal LOCK_STATE based on the first fast locking signal FM_PDOUT and the first normal locking signal COARSE and FINE. The first fast mode control signal FAST_MODE_END controls beginning and end of the fast locking operation and the first locking signal LOCK_STATE controls beginning and end of the coarse delay included in the first shift register 50A. The first locking signal LOCK_STATE is generated in response to the first coarse signal COARSE and the first fine signal FINE, and the first fast mode control signal FAST_MODE_END is generated in response to the first fast locking signal FM_PDOUT. A reset signal RESET resets the first mode controller 20A.

The second mode controller 20B performs substantially the same operation as that of the first mode controller 20A except for receiving the second fast locking signal FM_PD-OUTF and the second normal locking signal COARSEF and FINEF.

The first shift controller 40A generates a first right shift control signal RR and a first left shift control signal RL based on the first fast mode control signal FAST_MODE_END and the first locking signal LOCK_STATE. In detail, the first shift controller 40A generates the first right shift control signal RR and the first left shift control signal RL in order to control a relatively large change of a delay value delayed by the first shift register 50A in response to the first fast mode control signal FAST_MODE_END, the first locking signal LOCK_STATE and the first fine signal FINE.

The second shift controller 40B generates a second right shift control signal FR and a second left shift control signal FL based on the second fast mode control signal FAST_MODE_ENDF, the second locking signal LOCK_STATEF and the second fine signal FINEF.

The first shift register 50A generates a rising shift clock MIXOUT_R by delaying the first internal clock signal CLKIN1 by a delay value corresponding to the first right shift control signal RR and the first left shift control signal RL. The second shift register 50B generates a falling shift clock MIXOUT_F by delaying the second internal clock signal CLKIN2 by a delay value corresponding to the second right shift control signal FR and the second left shift control signal FL.

The pre-DCC unit 60 outputs a rising clock RISING_CLK and a falling clock FALLING_CLK by buffering the rising shift clock MIXOUT_R and the falling shift clock MIXOUT_F. The duty-correction unit 70 generates first and second duty-corrected clocks IFBCLKR and IFBCLKF and a duty-correction result signal DCC_ENB based on the rising clock RISING_CLK and the falling clock FALLING_CLK. The reset signal RESET is used to reset the duty-correction unit 70.

The delay model 80 generates the rising feedback clock FBCLKR and the falling feedback clock FBCLKF by delaying the first and second duty-corrected clocks IFBCLKR and IFBCLKF by a modeled value. At this point, the modeled value corresponds to a delay time of the system clock from being inputted to the semiconductor memory device to being transferred to a data output unit (not shown). The output driver 90 outputs first and second delay locked clocks IRCLKDLL and IFCLKDLL based on the first and second duty-corrected clocks IFBCLKR and IFBCLKF. The data output unit outputs a data to external in response to a transition of the first and second delay locked clocks IRCLKDLL and DFCLKDLL. As described above, if the data is outputted to an external device in synchronization with the transition of the first and second delay locked clocks IRCLKDLL and IFCLKDLL, it seems that the data is accurately outputted from the semiconductor memory device in synchronization with a transition of the system clock.

As a frequency of the system clock increases, an operating margin for outputting the data in synchronized with the rising edge and the falling edge of the system clock is gradually reduced. Specifically, because intervals of the transitions of the first and second delay locked clocks IRCLKDLL and IFCLKDLL become so short, the operating margin is not enough to output the data. Therefore, it is important to adjust the duty ratio of the first and second delay locked clocks IRCLKDLL and IFCLKDLL to 50% in order to secure the best operating margin.

Referring to FIG. 1, to adjust the duty ratio of the first and second delay locked clocks RICLKDLL and IFCLKDLL to 50%, the semiconductor memory device has the first shift controller 40A and the first shift register 50A operating based on the rising edge of the system clock, and has the second shift controller 40B and the second shift register 50B operating based on the falling edge of the system clock. After each delay locked operation, the duty-correction unit 70 senses the timing difference between transitions of the rising clock RISING_CLK and the falling clock FALLING_CLK and generates the first and second duty-corrected clocks IFBCLKF and IFBCLKF transitioning at the ½ location of the timing difference to finally generate the first and second delay locked clocks IRCLKDLL and IFCLKDLL based on the first and second duty-corrected clocks IRFBCLKF and IFBCLKF.

In this process, it may produce a clock skew caused by a difference of the circuit paths operating based on the rising edge and the falling edge of the system clock. Therefore, it is difficult for the duty-correction unit 70 to generate a clock whose duty ratio is accurately 50%. Since the respective delay locked operations are performed according to the falling edge and the rising edge of the system clock, it is difficult for two operations to be fully symmetrically performed. That is, the numbers of the unit delays provided in the first shift register 50A and the second shift register 50B may differ because one of them should invert the system clocks. Furthermore, as the DLL circuit requires two loop circuits for a delay-locked operation, the number of blocks included in the DLL circuit increases. As a result, a size of the DLL circuit and current consumption increase.

To solve this problem, the present invention proposes a DLL circuit capable of correcting easily the duty ratio to 50% with one DLL.

Figure 2:
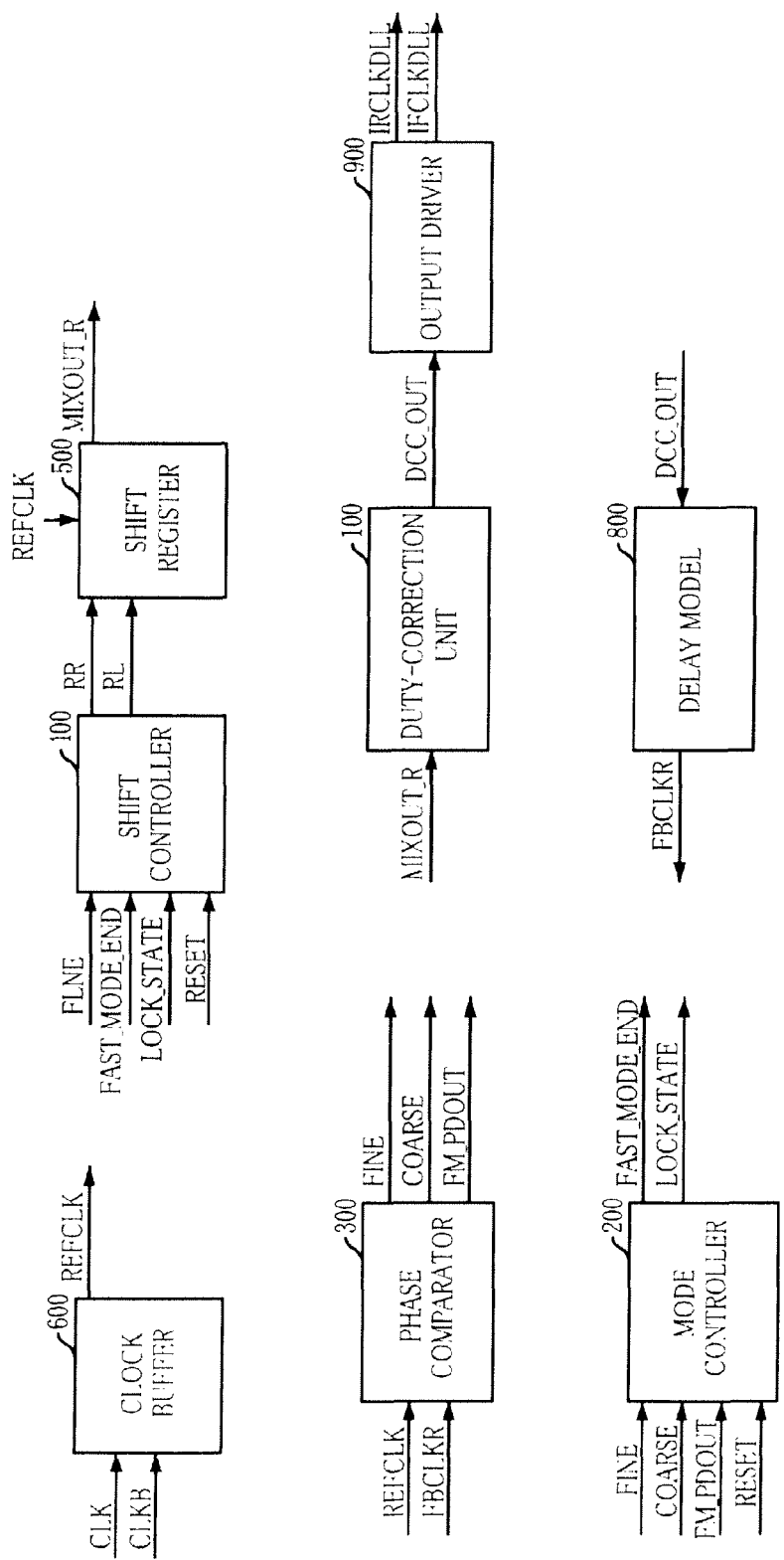
FIG. 2 is a schematic block diagram of a semiconductor memory device in accordance with an embodiment of the present invention.

FIG. 2 is a block diagram of a semiconductor memory device in accordance with an embodiment of the present invention.

As shown, the semiconductor memory device in accordance with the embodiment of the present invention includes a duty-correction unit 100, a mode controller 200, a phase comparator 300, a shift controller 400, a shift register 500, a clock buffer 600, a delay model 800, and an output driver 900. The mode controller 200, the phase comparator 300, the shift controller 400, the shift register 500, the clock buffer 600, the delay model 800, and the output driver 900 perform substantially the same operations of the same naming blocks as those of the semiconductor memory device illustrated in FIG. 1. However, because the duty-correction unit 100 performs a duty-correcting operation by receiving one shifting clock MIXOUT_R, only one shift controller 400 and shift register 500 are provided. That is, one loop performing a delay locked operation of the inputted clock is required.

Figure 3:
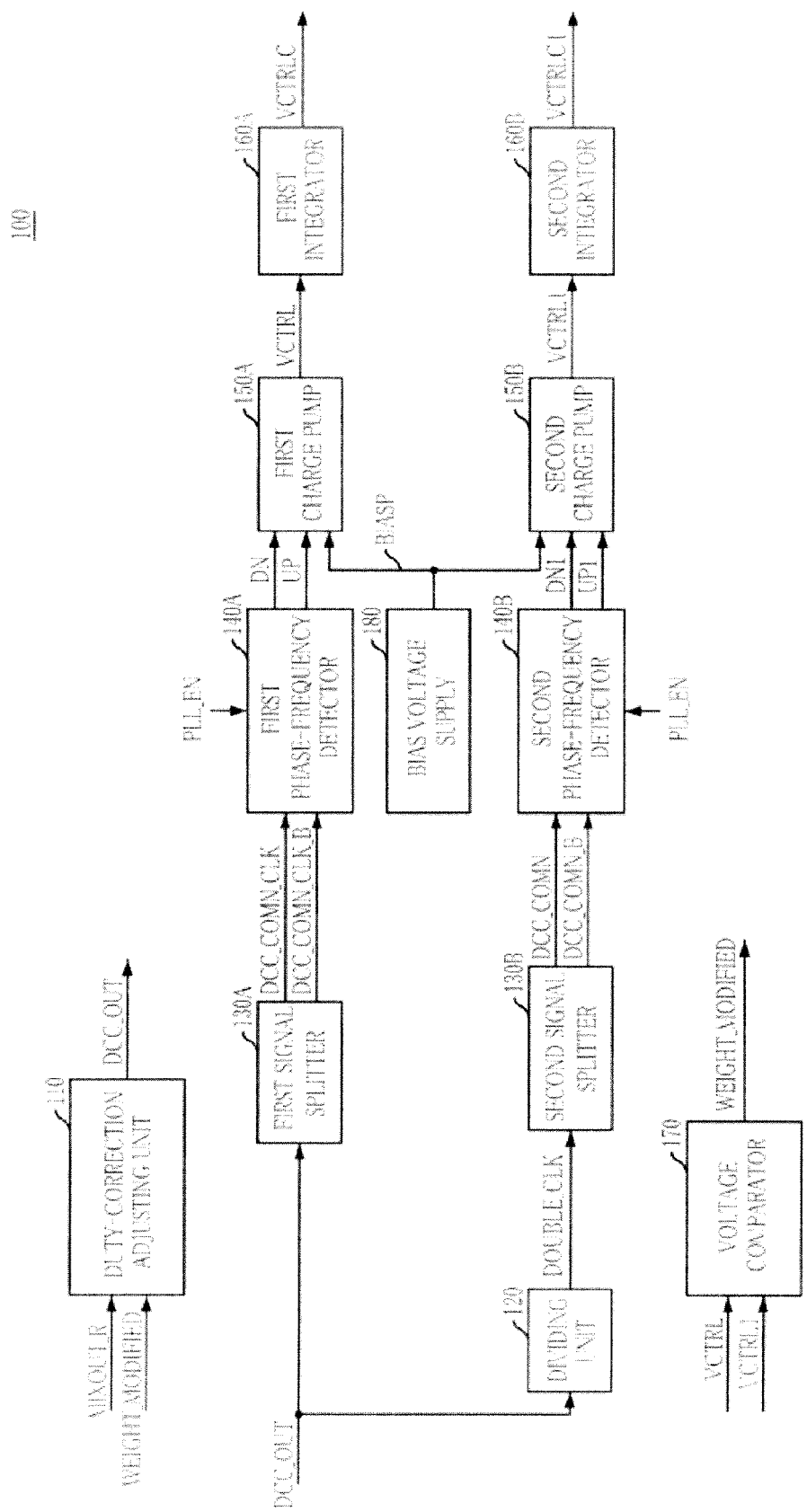
FIG. 3 is a block diagram of a duty correction circuit shown in FIG. 2.

FIG. 3 is a block diagram of the duty-correction unit 100 shown in FIG. 2.

As shown, the duty-correction unit 100 includes a duty-correction adjusting unit 110, a dividing unit 120, first and second clock signal splitters 130A and 130B, first and second phase-frequency detectors 140A and 140B, first and second charge pumps 150A and 150B, first and second integrators 160A and 160B, a voltage comparator 170, and a bias voltage supply 180.

The duty-correction adjusting unit 110 outputs a duty-corrected clock DCC_OUT by correcting a duty ratio of the shifting clock MIXOUT_R outputted from the shift register 500 in response to a comparison result signal WEIGHT_MODIFIED. The dividing unit 120 generates a divided clock DOUBLE_CLK by dividing the inputted duty-corrected clock DCC_OUT by a dividing ratio. Especially, in the present invention, the divide ratio includes an even value. For example, the dividing unit 120 divides duty-corrected clock DCC_OUT by 2 to output the divided clock DOUBLE_CLK. Although divided-by-2 is described above, it is possible to divide the duty-corrected clock DCC_OUT by the even value, so that a division circuit for a divided-by-even value can be applied to the present invention.

The first clock signal splitter 130A generates first and second splitting clocks DCC_COMN_CLK and DCC_COMN_CLK_B based on a rising edge and a falling edge of the duty-corrected clock DCC_OUT. The bias voltage supply 180 generates a bias voltage BIASP having a predetermined voltage level. The first phase-frequency detector 140A compares phases and frequencies of the first and second clocks DCC_COMN_CLK and DCC_COMN_CLK_B outputted from the first clock signal splitter 130A, and outputs first up and down result signals UP and DN based on the comparison result. The first charge pump 150A outputs a first comparison voltage VCTRL based on the first up and down signals UP and DN. The first integrator 160A continuously cumulates voltage levels of the first comparison voltage VCTRL. Therefore, the voltage levels of the first comparison voltage VCTRL rise up in response to a width of a logic high level and a logic low level of the duty-corrected clock DCC_OUT.

The second clock signal splitter 130B generates third and fourth splitting clocks DCC_COMN and DCC_COMN_B based on a rising edge and a falling edge of the divided clock DOUBLE_OUT. The second phase-frequency detector 140B compares phases and frequencies of the first and second clocks DCC_COMN and DCC_COMN_B outputted from the second clock signal splitter 130B, and outputs second up and down signals UP1 and DN1 based on the comparison result. The second charge pump 150B outputs a second comparison voltage VCTRL1 based on the second up and down signals UP1 and DN1. The second integrator 160B continuously cumulates voltage levels of the second comparison voltage VCTRL1. Therefore, the voltage levels of the second comparison voltage VCTRL1 rise up in response to a width of the logic high level and the logic low level of the duty-corrected clock DCC_OUT. Because the divided clock DOUBLE_CLK outputted from the dividing unit 120 is a clock generated by dividing the duty-corrected clock DCC_OUT by 2, the duty ratio of the divided clock DOUBLE_CLK is accurately 50%.

The second phase-frequency detector 140B outputs the second up and down signals UP1 and DN1 having the constant predetermined value. Thus, the second charge pump 150B supplies the second comparison voltage VCTRL1 with a regular value to the second integrator 160B. In addition, the voltage levels of the second comparison voltage VCTRL1 cumulated by the second integrator 160B keep up a regular value. The voltage comparator 170 compares a slope of the first comparison voltage VCTRL with that of the second comparison voltage VCTRL1 to generate the comparison result signal WEIGHT_MODIFIED0 corresponding to the comparison result. The duty-correction adjusting unit 110 corrects the duty ratio of the shifting clock MIXOUT_R outputted from the shift register 500 in response to the comparison result signal WEIGHT_MODIFIED. The duty-correction adjusting unit 110 repeats an operation of correcting the duty ratio of the shifting clock MIXOUT_R in response to the comparison result signal WEIGHT_MODIFIED until the slope of the first comparison voltage VCTRL is equal to that of the second comparison voltage VCTRL1. Equalizing the slope of first comparison voltage VCTRL with that of the second comparison voltage VCTRL1 means that the cumulating voltage levels of the first and second comparison voltages VCTRL and VCTRL1 are equal. Further, it means that the duty ratio of the duty-corrected clock DCC_OUT becomes 50% such as the divided clock DOUBLE_CLK having the duty ratio of 50%.

The semiconductor memory device in accordance with the embodiment of the present invention performs the delay locked operation through only one loop, thereby greatly reducing a size of the DLL circuit and current consumption according to the delay locked operation of the DLL circuit. Moreover, because the duty-corrected clock DCC_OUT is fed back and inputted to the phase frequency comparator 300 by using one clock, it is possible to compensate for a skew occurred when the delay locked operation is performed based on the rising edge and the falling edge of the duty-corrected clock DCC_OUT.

Figure 4A:
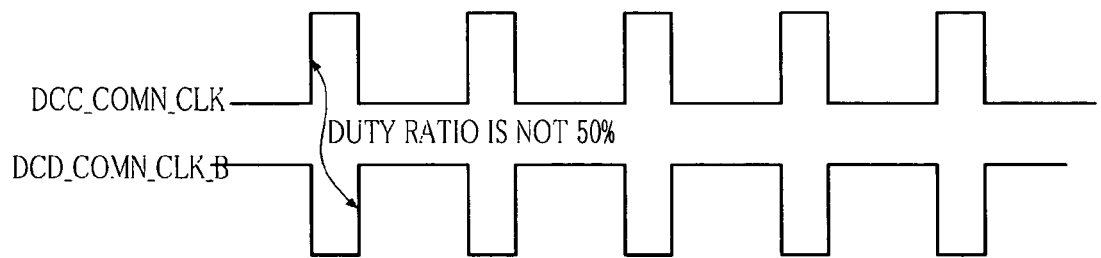
FIGS. 4A and 4B are a waveform diagrams describing an operation of the duty-correction circuit shown in FIG. 3.
Figure 4B:
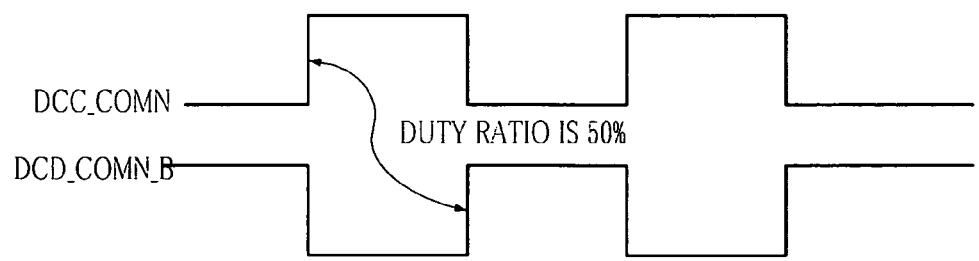

FIGS. 4A and 4B are waveform diagrams describing an operation of the duty-correction unit 100 shown in FIG. 3.

Figure 4C:
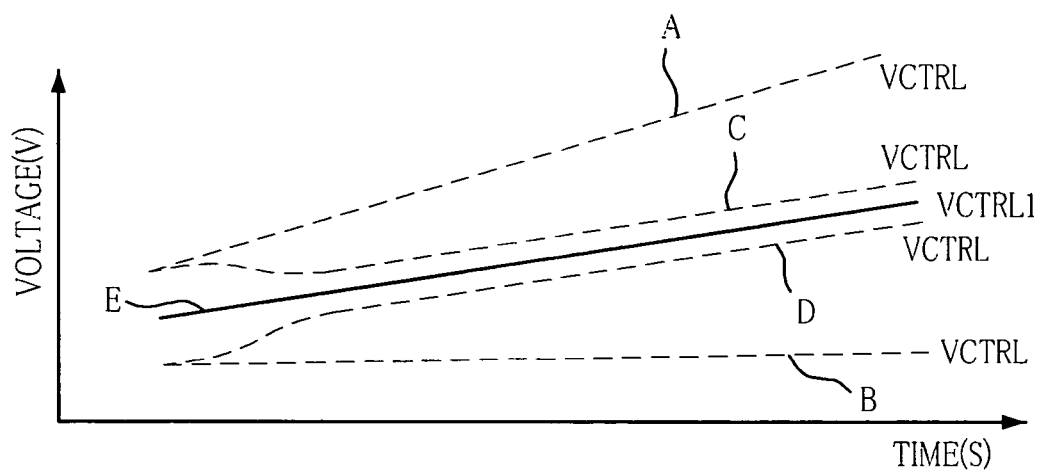
FIG. 4C is a corresponding graph.

As shown, the duty ratios of the third and fourth splitting clocks DCC_COMN and DCC_COMN_B outputted from the second clock signal splitter 130B are 50%, while the duty ratios of the first and second splitting clocks DCC_COMN_CLK and DCC_COMN_CLK_B outputted from the clock signal splitter 130A are not 50%. Referring to the graph in FIG. 4C, the cumulated slope of the second comparison voltage VCTRL1 always keeps up a regular value in response to the third and fourth splitting clocks DCC_COMN and DCC_COMN_B outputted from the second clock signal splitter 130B whose duty ratio is 50%. The cumulated slope of the first comparison voltage VCTRL is decided by a ratio of a width of the logic high level and the logic low level of the first and second splitting clocks DCC_COMN_CLK and DCC_COMN_CLK_B outputted from the first clock signal splitter 130A whose duty ratio is not 50%. If the ratio of the width of the logic high level is greater than that of the logic low level, the slope becomes 'A'. Otherwise, the slope becomes 'B'. Finally, the slope may be corrected to 'E' by the voltage comparator 170 and the duty-correction adjusting unit 110. That is, the slope 'A' becomes the slope 'C' and the slope 'B' becomes the slope 'D' to thereby be equalized with the slope 'E'.

Figure 5:
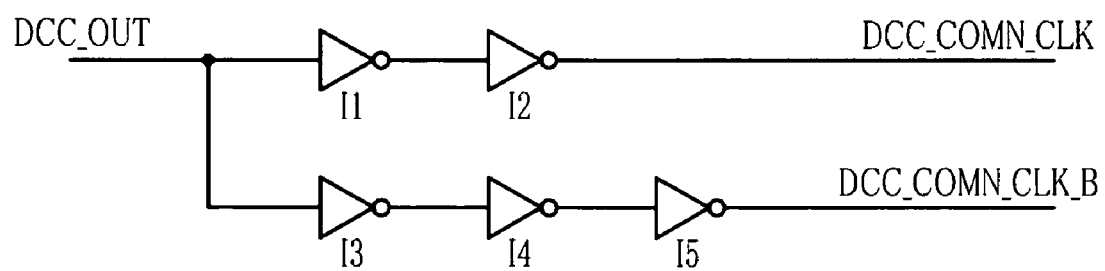
FIG. 5 is a circuit diagram of a first clock signal splitter shown in FIG. 3.

FIG. 5 is a circuit diagram of the first clock signal splitter 130A shown in FIG. 3.

As shown, the first clock signal splitter 130A has first and second inverters I1 and I2 in order to generate the first splitting clock DCC_COMN_CLK based on the rising edge of the duty-corrected clock DCC_OUT, and third to fifth inverters I3 to I5 in order to generate the second splitting clock DCC_COMN_CLK_B. The second clock signal splitter 130B has substantially the same structure as that of the first clock signal splitter 130A shown in FIG. 5.

Figure 6:
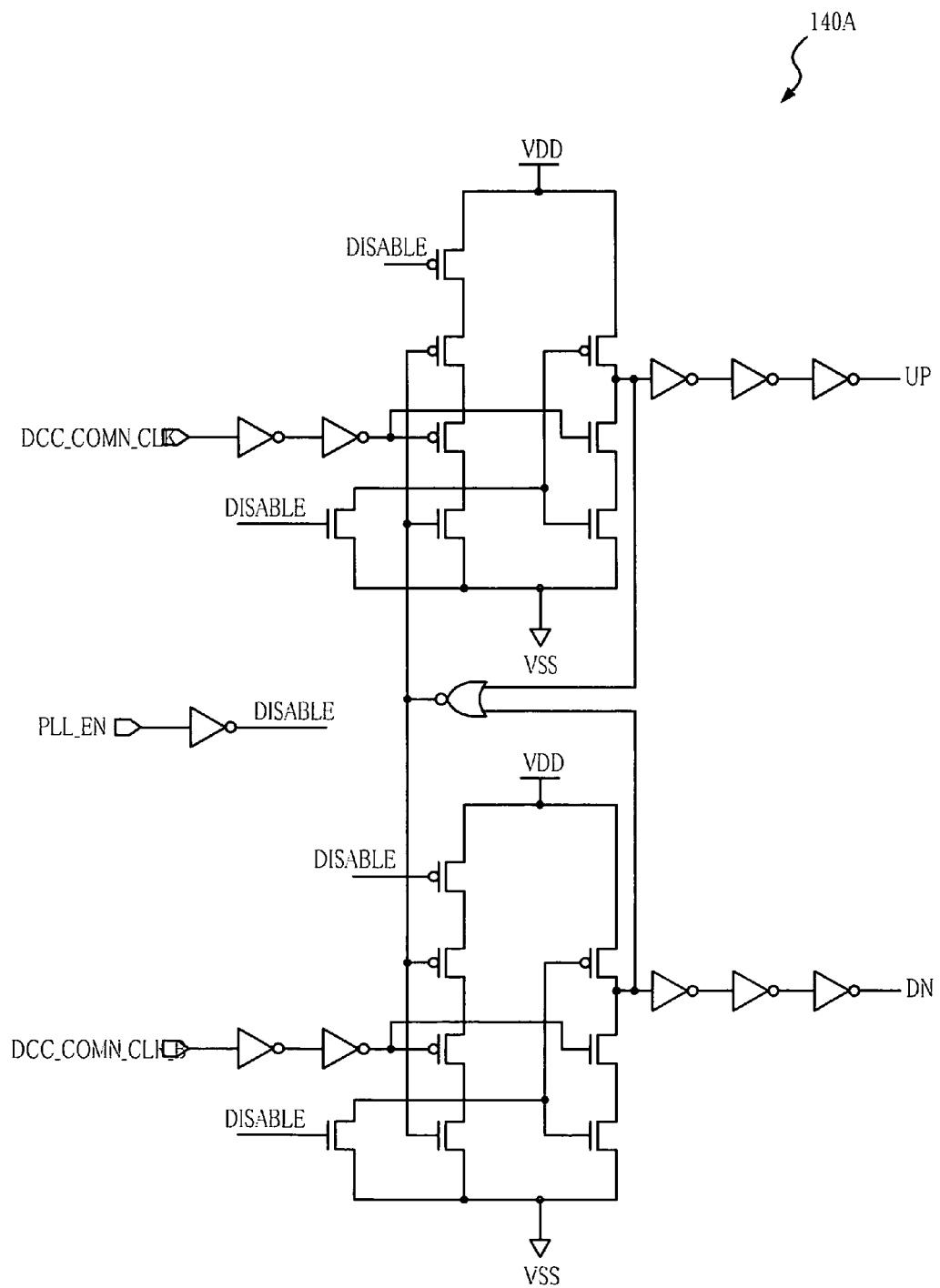
FIG. 6 is a circuit diagram of a first phase-frequency detector shown in FIG. 3.

FIG. 6 is a circuit diagram of the first phase-frequency detector 140A shown in FIG. 3.

As shown, the first phase-frequency detector 140A is activated in response to an enable signal PLL_EN. The first phase-frequency detector 140A generates the first up and down signals UP and DN corresponding to a width of the logic high level and the logic low level of the first and second splitting clocks DCC_COMN_CLK and DCC_COMN_CLK_B from the first clock signal splitter 130A. Further, the second phase-frequency detector 140B has substantially the same structure as that of the phase-frequency detector 140A except for receiving the third and fourth splitting clocks DCC_COMN and DCC_COMN_B outputted from the second clock signal splitter 130B.

Figure 7:
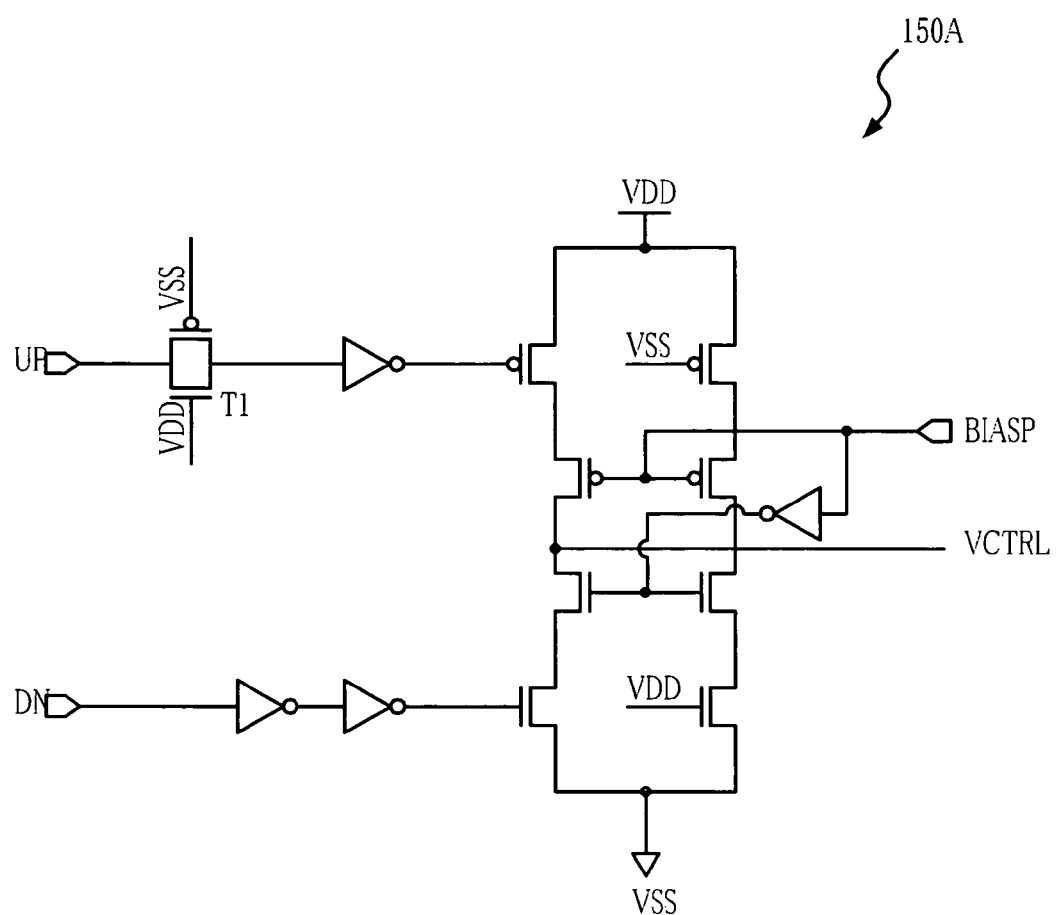
FIG. 7 is a circuit diagram of a first charge pump shown in FIG. 3.

FIG. 7 is a circuit diagram of the first charge pump 150A shown in FIG. 3.

As shown, the first charge pump 150A generates the first comparison voltage VCTRL having the voltage level corresponding to the logic values of the first up and down signals UP and DN. Further, the second charge pump 150B has substantially the same structure as that of the first charge pump 150A shown in FIG. 7. Herein, a transmission gate T1 synchronizes a transmission path of the first up signal UP with that of the first down signal DN.

While the present invention has been described with respect to the specific embodiments, it will be apparent to those skilled in the art that various transpositions, changes, and modifications may be made without departing from the spirit and scope of the invention as defined in the following claims.

What is claimed is:

1. A delay locked loop (DLL) circuit for use in a semiconductor memory device configured to generate a delay locked clock by a delay locked operation, comprising:
   a DLL configured for generating a shifting clock by delaying a reference clock;
   a duty-correction unit for generating a duty correction signal by correcting a duty ratio of the shifting clock based on the duty correction signal and a divided clock generated by dividing the duty correction signal by an even value; and
   an output driver for generating the delay locked clock in response to the duty correction signal,
   wherein the duty-correction unit generates first and second comparison voltages by cumulating voltages corresponding to first logic levels of the duty correction signal and the divided clock, respectively, and corrects the duty ratio by comparing a slope of the first comparison voltage with a slope of the second comparison voltage.

2. The delay locked loop circuit for use in the semiconductor memory device as recited in claim 1, wherein the divided clock is generated by dividing the duty correction signal clock by 2.

3. The delay locked loop circuit for use in the semiconductor memory device as recited in claim 1, wherein the DLL includes:
   a delay model for outputting a feedback clock by delaying the duty correction signal for a modeled value;
   a phase comparator for comparing a phase of the reference clock with that of the feedback clock; and
   a delay unit for adjusting a delay value of the reference clock based on the comparison result of the phase comparator to thereby output the shifting clock.

4. The delay locked loop circuit for use in the semiconductor memory device as recited in claim 1, wherein the duty-correction unit includes:
   a dividing unit for dividing the duty correction signal by the even value to output the divided clock;
   a first voltage generator for generating the first comparison voltage corresponding to the first logic level of the duty correction signal;
   a second voltage generator for generating the second comparison voltage corresponding to the first logic level of the divided clock;
   a first integrator for increasing a level of the first comparison voltage by cumulating the first comparison voltage;
   a second integrator for increasing a level of the second comparison voltage by cumulating the second comparison voltage;
   a comparator for comparing a slope of the first comparison voltage with that of the second comparison voltage; and
   a duty-correction adjusting unit for generating the duty correction signal based on the comparison result of the comparator.

5. The delay locked loop circuit for use in the semiconductor memory device as recited in claim 4, wherein the first voltage generator includes:
   a clock signal splitter for generating a first reference clock based on a first transition of the duty correction signal and a second reference clock based on a second transition of the duty correction signal;
   a phase-frequency detector for detecting phases and frequencies of the first reference clock and the second reference clock to output a detecting signal based on a detected result; and
   a charge pump for generating the first comparison voltage by pumping a charge in response to the detecting signal.

6. The delay locked loop circuit for use in the semiconductor memory device as recited in claim 4, wherein the second voltage generator includes:
   a clock signal splitter for generating a first reference clock based on a first transition of the divided clock and a second reference clock based on a second transition of the divided clock;
   a phase-frequency detector for detecting phases and frequencies of the first reference clock and the second reference clock to output a detecting signal based on a detected result; and
   a charge pump for generating the second comparison voltage by pumping a charge in response to the detecting signal.

7. A semiconductor memory device, comprising:
   a phase comparator for comparing a reference clock with a feedback clock;
   a delay circuit unit for delaying the reference clock based on the comparison result of the phase comparator to output a shifting clock;
   a dividing unit for dividing a duty correction signal by an even value to output a divided clock;
   a first voltage generator for generating a first comparison voltage by cumulating a value corresponding to a width of a first logic level of the duty correction signal;
   a second voltage generator for generating a second comparison voltage by cumulating a value corresponding to a width of a first logic level of the divided clock;
   a voltage comparator for comparing a slope of the first comparison voltage with that of the second comparison voltage;
   a duty-correction unit for generating the duty correction signal in response to a comparison result of the voltage comparator;
   a delay model for outputting the feedback clock by delaying the duty correction signal for a modeled value; and
   an output driver for generating a delay locked clock whose duty ratio is corrected in response to the duty correction signal.

8. The semiconductor memory device as recited in claim 7, wherein the divided clock is generated by dividing the delayed clock by 2.

9. The semiconductor memory device as recited in claim 7, wherein the first voltage generator includes:
   a clock signal splitter for generating a first reference clock based on a first transition of the duty correction signal and a second reference clock based on a second transition of the duty correction signal;
   a phase-frequency detector for detecting phases and frequencies of the first and second reference clocks to output a detecting signal based on a detected result;
   a charge pump for generating the first comparison voltage by pumping a charge in response to the detecting signal; and an integrator for increasing a level of the first comparison voltage by cumulating the first comparison voltage.

10. The semiconductor memory device as recited in claim 7, wherein the second voltage generator includes:
a clock signal splitter for generating a first reference clock based on a first transition of the divided clock and a second reference clock based on a second transition of the divided clock;
a phase-frequency detector for detecting phases and frequencies of the first reference clock and the second reference clock to output a detecting signal based on a detected result;
a charge pump for generating the second comparison voltage by pumping a charge in response to the detecting signal; and
an integrator for increasing a level of the second comparison voltage by cumulating the second comparison voltage.

11. A semiconductor memory device, comprising:
a dividing unit for dividing a reference duty corrected clock by an even value to output a divided clock;
a first voltage generator for generating a first comparison voltage by accumulating values corresponding to a width of a first logic level of the reference duty corrected clock;
a second voltage generator for generating a second comparison voltage by accumulating values corresponding to a width of a first logic level of the divided clock outputted from the dividing unit;
a comparator for comparing a slope of the first comparison voltage with that of the second comparison voltage; and
a duty-correction adjusting unit for correcting a duty ratio of a shifting clock signal based on the comparison result of the comparator and generates the reference duty corrected clock.

12. The semiconductor memory device as recited in claim 11, wherein the first voltage generator includes:
a clock signal splitter for generating a first reference clock based on a first transition of the reference clock and a second reference clock based on a second transition of the reference clock;
a phase-frequency detector for detecting phases and frequencies of the first reference clock and the second reference clock to output a detecting signal based on a detected result;
a charge pump for generating the first comparison voltage by pumping a charge in response to the detecting signal; and
a first integrator for increasing a level of the first comparison voltage by cumulating the first comparison voltage.

13. The semiconductor memory device as recited in claim 11, wherein the second voltage generator includes:
a clock signal splitter for generating a first reference clock based on a first transition of the divided clock and a second reference clock based on a second transition of the divided clock;
a phase-frequency detector for detecting phases and frequencies of the first reference clock and the second reference clock to output a detecting signal based on a detected result;
a charge pump for generating the second comparison voltage by pumping a charge in response to the detecting signal; and
an integrator for increasing a level of the second comparison voltage by cumulating the second comparison voltage.

14. A method for driving a semiconductor memory device, comprising;
generating a duty correction signal by correcting a duty ratio of a shift clock signal based on the duty correction signal and a divided clock generated by dividing the duty correction signal by an even value; and
generating a delay locked clock based on the duty correction signal,
wherein the correcting of the duty ratio includes correcting the duty ratio by comparing a slope of a first comparison voltage, to which a voltage corresponding to a first logic level of the duty correction signal is cumulated, with that of a second comparison voltage, to which a voltage corresponding to the first logic level of the divided clock is cumulated.

15. The method for driving a semiconductor memory device as recited in claim 14, wherein the generating of a delay locked clock includes:
comparing a phase of a reference clock with that of a feedback clock to produce a comparison result;
adjusting a delay value based on the reference clock and the comparison result; and
outputting the feedback clock by delaying the adjusted delay value for a modeled value.

16. The method for driving a semiconductor memory device as recited in claim 14, wherein the correcting of the duty ratio includes:
dividing the duty correction signal by the even value;
generating the first comparison voltage corresponding to the first logic level of the duty correction signal and cumulating the first comparison voltage;
generating the second comparison voltage corresponding to the first logic level of the divided clock and cumulating the second comparison voltage;
comparing a slope of the first comparison voltage with that of the second comparison voltage; and
generating the delay locked clock based on the duty correction signal.

17. The method for driving a semiconductor memory device as recited in claim 16, wherein the generating of the first comparison voltage includes:
generating a first reference clock based on a first transition of the duty correction signal and a second reference clock based on a second transition of the duty correction signal;
detecting phases and frequencies of the first reference clock and the second reference clock to output a detecting signal based on a detected result; and
generating the first comparison voltage by pumping a charge in response to the detecting signal.

18. The method for driving a semiconductor memory device as recited in claim 16, wherein the generating of the second comparison voltage includes:
generating a first reference clock based on the first transition of the divided clock and a second reference clock based on the second transition of the divided clock;
detecting phases and frequencies of the first reference clock and the second reference clock to output a detecting signal based on a detected result; and
generating the second comparison voltage by pumping a charge in response to the detecting signal.

19. A semiconductor memory device, comprising;
a delay locked loop (DLL) unit for generating a delay clock by performing a delay locked operation;
a dividing unit for dividing a duty correction signal by an even value to output a divided clock;

a first voltage generation unit for generating a first comparison voltage by cumulating a value corresponding to a width of a first logic level of the duty correction signal;

a second voltage generation unit for generating a second comparison voltage by cumulating a value corresponding to a width of a first logic level of a divided clock generated by dividing the duty correction signal by an even value;

a duty-correction unit for correcting a duty ratio of the delay clock and generating the duty correction signal; and an output driver for generating the delay locked clock in response to the reference clock, wherein the duty-correction unit corrects the duty ratio by comparing a slope of the first comparison voltage with a slope of the second comparison voltage.

20. The semiconductor memory device as recited in claim 19, wherein the DLL unit includes:

a phase comparator for comparing a phase of a reference clock with that of a feedback clock;

a delay unit for adjusting a delay value of the reference clock based on the comparison result of the phase comparator; and a delay model for outputting the feedback clock by delaying the duty correction signal for a modeled value.

21. The semiconductor memory device as recited in claim 19, wherein the first voltage generation unit includes:

a clock signal splitter for generating a first reference clock based on a first transition of the delay locked clock and a second reference clock based on a second transition of the duty correction signal;

a phase-frequency detector for detecting phases and frequencies of the first reference clock and the second reference clock to output a detecting signal based on a detected result;

a charge pump for generating the first comparison voltage by pumping a charge in response to a detecting signal; and an integrator for cumulating the first comparison voltage.

22. The semiconductor memory device as recited in claim 19, wherein the second voltage generation unit includes:

a clock signal splitter for generating a first reference clock based on a first transition of the divided clock and a second reference clock based on a second transition of the divided clock;

a second phase-frequency detector for detecting phases and frequencies of the first reference clock and the second reference clock to output a detecting signal based on a detected result;

a second charge pump for generating the second comparison voltage by pumping a charge in response to the detecting signal; and a second integrator for cumulating the second comparison voltage.

* * * * *